United States Patent
Nielsen

(12) United States Patent (10) Patent No.: US 7,479,840 B2
Nielsen (45) Date of Patent: Jan. 20, 2009

(54) DIGITAL PULSE WIDTH CONTROLLED OSCILLATION MODULATOR

(75) Inventor: Ole Neis Nielsen, København N (DK)

(73) Assignee: Bang & Olufsen Icepower A/S, Lyngby (DK)

( * ) Notice: Subject to any disclaimer, the term of this patent is extended or adjusted under 35 U.S.C. 154(b) by 8 days.

(21) Appl. No.: 10/548,432

(22) PCT Filed: Mar. 23, 2004

(86) PCT No.: PCT/IB2004/000852

§ 371 (c)(1),
(2), (4) Date: Feb. 13, 2006

(87) PCT Pub. No.: WO2004/086629

PCT Pub. Date: Oct. 7, 2004

(65) Prior Publication Data

US 2006/0232351 A1 Oct. 19, 2006

(30) Foreign Application Priority Data

Mar. 24, 2003 (SE) .................................. 0300780

(51) Int. Cl.
*H03K 7/08* (2006.01)
(52) U.S. Cl. .................. 332/109; 330/10; 341/143; 375/238

(58) Field of Classification Search ................. 332/109; 375/238; 341/143; 310/10
See application file for complete search history.

(56) References Cited

U.S. PATENT DOCUMENTS

| 5,420,892 | A | * | 5/1995 | Okamoto | 375/350 |
| 5,777,512 | A | * | 7/1998 | Tripathi et al. | 330/207 A |
| 5,886,586 | A | * | 3/1999 | Lai et al. | 332/109 |
| 6,390,579 | B1 | | 5/2002 | Roylance et al. | |
| 6,768,779 | B1 | * | 7/2004 | Nielsen | 375/297 |

FOREIGN PATENT DOCUMENTS

| WO | WO 97/37433 | A1 | 10/1997 |
| WO | WO 02/25357 | A2 | 3/2002 |
| WO | WO 02/089321 | A1 * | 11/2002 |

\* cited by examiner

*Primary Examiner*—Robert Pascal
*Assistant Examiner*—Levi Gannon
(74) *Attorney, Agent, or Firm*—Harness, Dickey & Pierce, PLC

(57) ABSTRACT

A pulse width modulator (10) for converting a digital signal into a PWM signal, comprising a plurality of integrators (11) with integrator gains (12) arranged in series, a comparator (17) for comparing the output of the last integrator (11') with a reference, and thereby creating the PWM signal. The modulator further has means (13) for realizing self-oscillation at a desired switching frequency, and a feedback path (14) connected to a point down stream said comparator and leading to a plurality of summing points, each preceding one of said integrators, wherein the PWM signal is quantized in time by the clock frequency of the modulator, and wherein the integrator gains (12) are adapted to reduce any quantization noise.

23 Claims, 4 Drawing Sheets

| order | $k_1$ | $k_2$ | $k_3$ | $k_4$ | $k_5$ |
|---|---|---|---|---|---|
| | Butterworth | | | | |
| 1 | 1 | - | - | - | - |
| 2 | 1 | 0.50000 | - | - | - |
| 3 | 1 | 0.50000 | 0.25000 | - | - |
| 4 | 1 | 0.50000 | 0.29292 | 0.14645 | - |
| 5 | 1 | 0.50000 | 0.30901 | 0.19099 | 0.095488 |
| | Bessel | | | | |
| 1 | 1 | - | - | - | - |
| 2 | 1 | 0.33333 | - | - | - |
| 3 | 1 | 0.41667 | 0.16667 | - | - |
| 4 | 1 | 0.45002 | 0.23333 | 0.09999 | - |
| 5 | 1 | 0.46667 | 0.26667 | 0.15000 | 0.066667 |

*Figure 11*

| order | $k_1$ | $k_2$ | $k_3$ | $k_4$ | $k_5$ |
|---|---|---|---|---|---|
| | *Coefficient ratio in multiples of 2* | | | | |
| 3 | 1 | 0.25 | 0.25 | - | - |
| 3 | 1 | 0.5 | 0.25 | - | - |
| 3 | 1 | 1 | 0.25 | - | - |
| 4 | 1 | 0.50000 | 0.50000 | 0.12500 | - |
| 4 | 1 | 1 | 0.50000 | 0.25000 | - |
| 4 | 1 | 1 | 0.25000 | 0.12500 | - |
| 4 | 1 | 0.50000 | 0.25000 | 0.12500 | - |
| 5 | 1 | 0.50000 | 0.25000 | 0.12500 | 0.12500 |
| 5 | 1 | 1 | 0.25000 | 0.12500 | 0.12500 |

*Figure 12*

DIGITAL PULSE WIDTH CONTROLLED OSCILLATION MODULATOR

TECHNICAL FIELD

The present invention relates in general to a digital pulse width modulator, and to a power conversion system implementing such a modulator. More specifically, the invention relates to a system for conversion of sampled digital signals such as Pulse Code Modulated (PCM) signals to a Pulse Width Modulated (PWM) signal, also known as PCM-PWM conversion.

TECHNICAL BACKGROUND

Prior art digital PWM modulators generate a pulse width modulated signal with a carrier frequency of minimum twice the signal frequency to comply with the Nyquist criteria. The objective for such a system implementation is to achieve noise and distortion artifacts lower than quantization noise of the sampled signals, which is a challenging task when operating with sampled audio signals of 24 bit resolution. The result is a complex and expensive system.

In the art well-known systems are known e.g. from the document WO 97/37433. Such a system is illustrated in FIG. 1, and comprises a sample rate converter 1, an oversampler 2, a noise shaper 4 and an error correcting algorithm unit 3.

This prior art approach suffers from several drawbacks.

Firstly, the carrier frequency is dependent on the sample frequency, making the use of a sample rate converter 1 necessary. Especially as audio media comes in many different formats, sample rate conversion becomes mandatory. The sample rate converter 1 can be complex to implement due to high order filtering. Quantization errors and aliasing will be introduced leading to reduced dynamic ranges.

Further, in order to increase the dynamic range, an error correcting algorithm 3 and a noise shaper 4 must be comprised in the design leading to unnecessary complexity and cost.

Further, the noise shaper 3 is limited in bandwidth, as the maximum loop gain to suppress the quantization noise is constrained by the stability of the noise shaping loop. Therefore, the noise shaper 4 does still not achieve a satisfactory dynamic range.

Analog PWM modulators where an analog input signal is converted into a PWM signal is also known from prior art systems. In order to obtain a stable system and shape the control loop characteristics, such prior art systems often require additional lead-, lag, lead-lag or lag-lead compensators in the control structure.

Prior art modulator systems based on non-oscillating triangular modulation are greatly reduced in loop gain by necessary demands of phase-margins for the loop to stay stabile. Self-oscillating systems, as described e.g. in WO 02/25357, do not need a phase margin and will have higher loop gain to suppress error and noise components. However, self-oscillating modulators have not yet been implemented successfully in the digital domain.

OBJECT OF THE INVENTION

The object of the present invention is to overcome or at least mitigate the above problems, and provide a non-complex system capable of receiving a sampled digital input signal and converting it to PWM domain.

SUMMARY OF THE INVENTION

According to a first aspect of the invention, this and other objects are achieved by a pulse width modulator comprising a plurality of integrators with integrator gains arranged in series, a comparator for comparing the output of the last integrator with a reference, and thereby creating the PWM signal, means for realizing self-oscillation at a desired switching frequency, and a feedback path connected to a point down stream said comparator and leading to a plurality of summing points, each preceding one of said integrators. The PWM signal is quantized in time by the clock frequency of the modulator, and the integrator gains are adapted to reduce any quantization noise.

By choosing an appropriate number of integrators, each having a suitable gain, the loop gain is thus set to reduce the noise generated by quantization in the system. At the same time, the system can provide an improved loop gain bandwidth corresponding to the switching frequency, leading to much wider control bandwidths compared to prior art systems. This leads to even higher suppression of noise and distortion components within the modulator bandwidth, since the ratio between the switching frequency and the modulator bandwidth can be less than in prior art systems. Although quantization noise has been mentioned specifically, it is clear that any noise introduced into the modulator will be reduced by the invention.

According to the invention, the noise can be reduced to levels corresponding to the resolution of the digital input signal, typically a 24-bit signal. The effect of the multiple feedback loop and the integrators with gain is similar to that of the noise shaper of prior art, but the self-oscillating nature of the system has the benefit of higher loop gain in the modulator loop compared to what can be obtained by a noise shaper. The obtainable dynamic range is therefore higher than prior art, and at the same time the use of noise shapers is eliminated.

Further, because of its self-oscillating nature, the modulator is independent of the format of the input signal, especially regarding the sampling frequency, the modulator according to the invention need not to be synchronized with the signal source. This is of great benefit and eliminates the use of prior art sample rate converters and oversamplers.

The elimination of noise shapers, sample rate converters and oversamplers, together with the fact that only integrators are used for loop shaping, results in a very low system complexity. In fact, it is possible to implement a complete system according to the invention without the use of memory circuits. A modulator according to the invention can be implemented on less than 10% of the silicon area required for a prior art modulator. Efficiency is improved and cost is reduced dramatically.

The modulator according to the invention further provides a carrier frequency (equal to the switching frequency) which varies with the modulation index. Such Variable carrier Frequency Pulse Width Modulation (VFPWM) is known from analogue self oscillating systems, and is of great benefit for the efficiency of the output stage, EMI and switching component stress. Until now, there has been no equivalent technology adapted for the digital domain.

According to one embodiment, the feedback path is connected directly to the output of the comparator. This results in a modulator that is functionally separated from any switching stage amplification or other elements supplied with the PWM signal.

The integrator gains can be selected so that the system transfer function is a low pass filter, where the loop gain is equal to the mirrored frequency response around the cut-off frequency. Such a design is particularly advantageous for audio implementations.

In particular, the system transfer function can be implemented as a Bessel or Butterworth low-pass filter. These filter implementations provide very suitable frequency characteristics and sensitivity functions which will provide a stabile and very robust system. Furthermore it will be easy to shape the overall system characteristics.

According to one embodiment of the invention, the integrator gains are selected according to $$G_n = \frac{G_{n-1}}{2^M},$$

where $G_n$ is the gain of integrator n, and M ∈ [0, ∞], so that the gains are equal or separated by a factor of 2. Such gains can easily be realized as a shifting function, with greatly reduced complexity.

A signal amplitude limiter can be provided following each integrator gain, preferably with a limitation corresponding to a dynamic range of the input signal. The amplitude limiters serve to stabilize the feedback loops in the case of aggressive loop implementations, implemented to achieve high performance with very few integrators.

The self-oscillation can be achieved with a positive feedback of the comparator. This design results in a hysteresis loop which brings the system to a controlled oscillation and hereby generates the modulator carrier signal. The switching frequency is determined by the integrator gain immediately preceding the comparator.

The self-oscillation can alternatively be achieved by a filter or time delay preceding the comparator, said filter or time delay being arranged to give the system an open loop phase lag of 180 degrees at the desired switching frequency. The phase-lag will result in a non-hysteresis oscillation, thus generating the modulator carrier signal.

A second aspect of the invention, is a power conversion system comprising a modulator according the first aspect of the invention, a switching stage connected to the oscillation control, and an output filter connected to the switching stage.

Such a power converter is very suitable in all types of precision DC-AC conversion applications such as audio amplification, motor or electro-dynamic transducer drive applications or line drivers for line transmission.

BRIEF DESCRIPTION OF THE DRAWINGS

These and other aspects of the present invention will be further described in the following, with reference to the appended figures showing currently preferred embodiments of the invention.

FIG. 11 is a table of normalized gain coefficients for realizing a Butterworth or Bessel system up to fifth order (N=5).

FIG. 12 is a table of normalized gain coefficients according to a further embodiment of the invention.

DETAILED DESCRIPTION OF THE PREFERRED EMBODIMENTS

Figure 1:
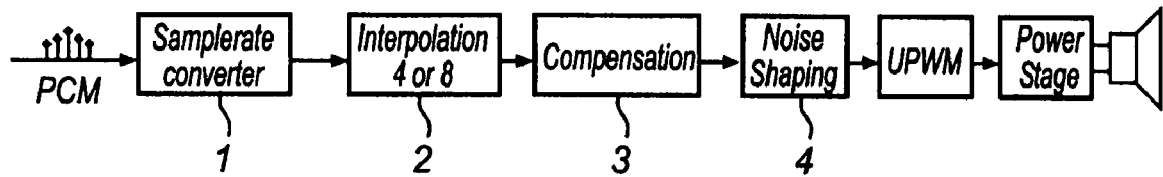
FIG. 1 is a schematic block diagram of a prior art PCM-PWM conversion system.
Figure 2:
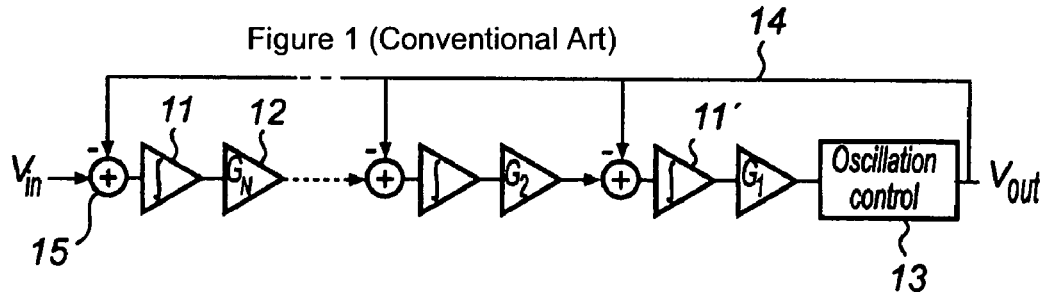
FIG. 2 is a schematic block diagram of a modulator according to a first preferred embodiment of the invention.

FIG. 2 is a general block diagram of a modulator 10 according to a first preferred embodiment of the invention. The modulator comprises a chain of serially connected integrators 11, with associated integrator gains 12, the output of this chain being connected to an oscillation control 13. Note that the integrator gains 12 are shown as separate elements. In practice, and as will be shown with reference to FIG. 7, the integrator has an inherent gain, and then an additional adjustment of this gain is provided. The adjustment can very well be an attenuation of the integrator gain.

Figure 8:
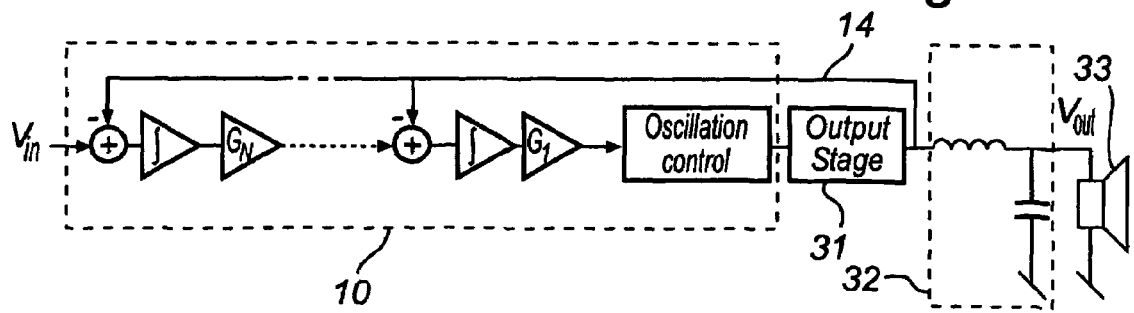
FIG. 8 is a schematic block diagram of a power conversion system according to a second preferred embodiment of the invention.

The oscillation control 13 is arranged to cause self-oscillation of the modulator, and includes a comparator 17, (see FIGS. 5 and 6) for comparing the output of the last integrator 11' in the integrator chain with a reference. Preferably, the comparator 17 is a simple sign detector, in which case the reference is the ground level. The result of this comparison is the PWM signal, which can be supplied to a switching amplifier power stage, as illustrated in FIG. 8. A feedback path 14 is connected to a point downstream the oscillation control, and arranged to provide a negative feedback signal to summation points 15 provided immediately preceding each integrator 11.

The system is implemented as a general N'th order lowpass system by selecting the integrator gains 12 in a suitable way, where the number of integrators N equals the order of the system. The output carrier is created by deliberately causing the loop to be unstable, and the resulting oscillation frequency is the carrier frequency, typically in the area of 500 KHz.

Figure 3:
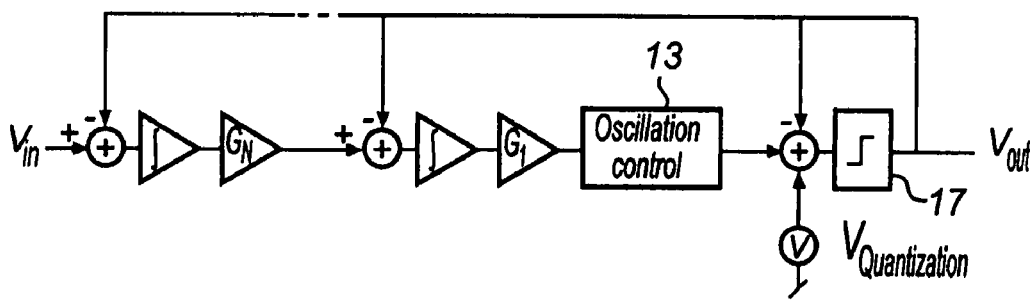
FIG. 3 shows introduction of quantization noise in the modulator shown in FIG. 2.

The generation of the PWM signal is quantized in time by the clock frequency of the digital system, typically in the area of 100-200 MHz. With a carrier (switching) frequency of around 500 kHz, this gives a time resolution of each carrier cycle of around 200-400, or 7-9 bits. This quantization results in quantization noise in the same way as in the case of the oversampler of prior art. FIG. 3 illustrates schematically how the quantization noise is introduced into the system.

By shaping the loop function by means of the integrator gains 12, the quantization noise can be suppressed to an almost infinitesimal level in the total audio band.

Figure 4:
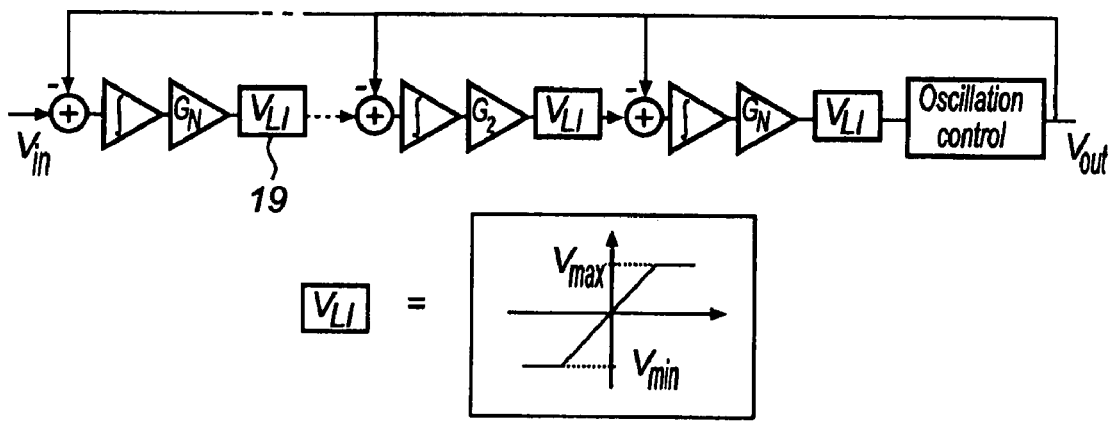
FIG. 4 is a schematic block diagram of the modulator shown in FIG. 2, comprising voltage limitation of the integrator outputs.

As shown in FIG. 4, voltage limiters can be provided on the output of each integrator gain 12.

Figure 5:
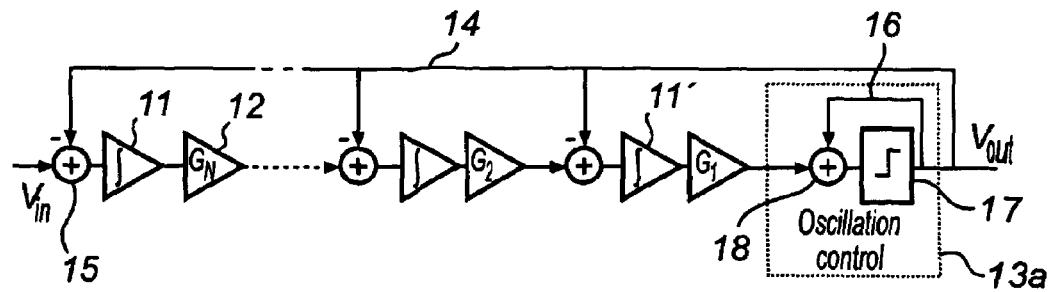
FIG. 5 is a schematic block diagram of the modulator shown in FIG. 2, comprising hysteresis oscillation.

FIG. 5 illustrates how the oscillation control 13 in FIG. 2 can be implemented as a hysteresis control 13*a*. A positive feedback 16 is provided from the output of the comparator 17 to a summation point 18 preceding the comparator. The hysteresis oscillation control 13*a* has the liberalized transfer function O(s)=1. A liberalized expression of the total system transfer function can be written as:

$$H(s) = \frac{\prod_{k=1}^{N} G_k}{\sum_{m=1}^{N}\left(S^{m-1}\prod_{k=1}^{N+1-m} G_k\right) + S^N}, \quad (1)$$

where $G_k$ is the integrator gain of integrator k. The skilled person will see that the transfer function is a general low pass function, and by adjusting the integrator gains the pole configuration can be set to form for example a Butterworth or Bessel filter characteristic.

In the case of a hysteresis controlled self oscillation, as illustrated in FIG. 3, the switching frequency is determined by the gain $G_1$ of the first integrator 11' and can be calculated easily as follows:

$$F_{SW} = \frac{G_1}{4} [Hz] \quad (2)$$

This constraint, that the gain $G_1$ of the integrator 11' immediately preceding the oscillation control 13a is fixed, will cause the pole configuration to result in lower cut off frequency as the order rises. In practice this is not a problem because the order necessary for a satisfactory dynamic range is well below the order where limitation of frequency response starts.

Figure 9:
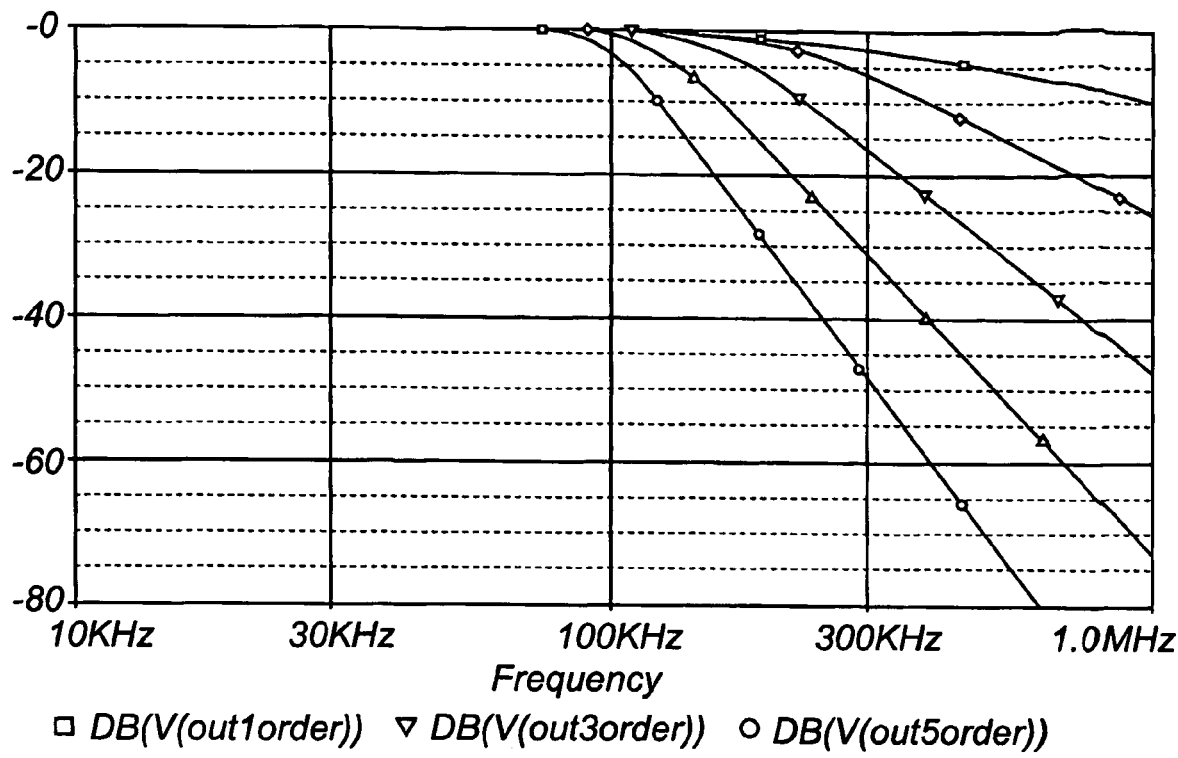
FIG. 9 shows the frequency response of a modulator with Butterworth configurations up to fifth order (N=5).

FIG. 9 shows the frequency response for the system in FIG. 5 with Butterworth configuration, order N=1,2,3,4 and 5. It is clear that the cut off frequency is well beyond the audio range. It is also clear that the cut off frequency is falling at rising order, as was explained above.

When implementing loops of high order, high loop gain suppresses errors arising from the implementation. The sensitivity function can be written as:

$$S(s) = \frac{S^N}{\sum_{m=1}^{N}\left(S^{m-1}\prod_{k=1}^{N+1-m} G_k\right) + S^N}. \quad (3)$$

Figure 10:
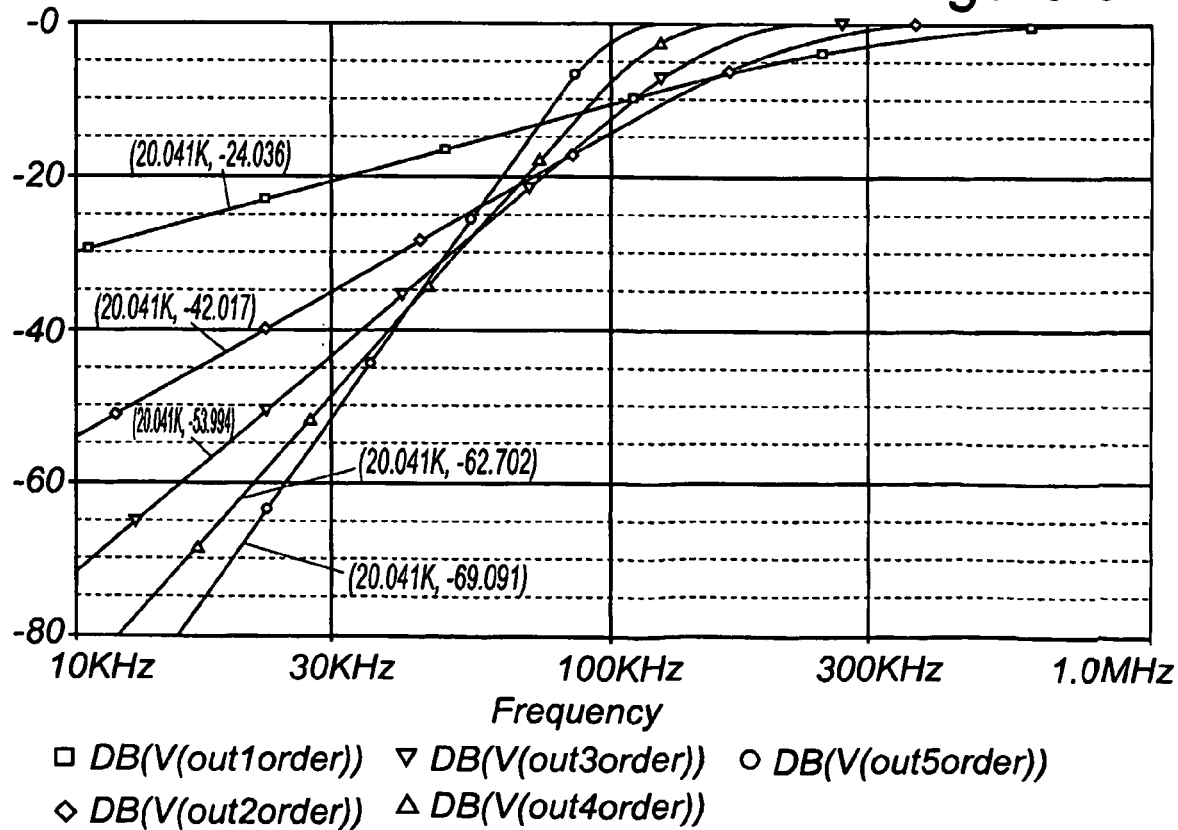
FIG. 10 shows the sensitivity response of a modulator with Butterworth configuration up to fifth order (N=5).

FIG. 10 shows the sensitivity response S(s) for the system in FIG. 5 with Butterworth configuration, order N=1,2,3,4 and 5. The diagram shows the reduction of the quantization noise and other distortion components. For example, for a fifth order system, any errors will be reduced with up to 69 dB at 20 KHz.

The frequency response and the sensitivity response as seen in FIGS. 9 and 10 are obtained using the gain coefficients for Butterworth characteristics given in FIG. 11, where different filter coefficients are given for orders N=1-5. The gain coefficients $k_N$ in FIG. 11 are normalized with respect to $G_1$. The relation between $G_1$ and the switching frequency given above (Eq. 2) results in a integrator gain $G_1$ according to following expression:

$$G_1 = 4 * F_{SW} \quad (4)$$

Figure 6:
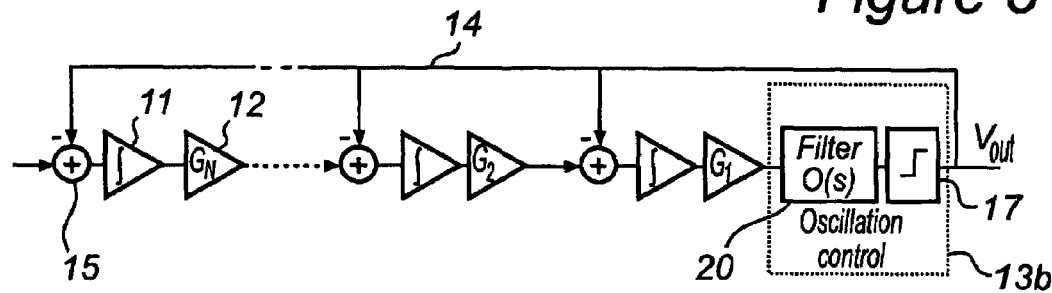
FIG. 6 is a schematic block diagram of the modulator shown in FIG. 2, comprising non-hysteresis oscillation.

FIG. 6 illustrates how the oscillation control 13 in FIG. 2 can be implemented as a non-hysteresis control 13b. The oscillation control 13b now includes a control block 20 for creating an open loop phase lag. The self-oscillation can be achieved by providing phase lag of 180 degrees or a delay corresponding to a 180-degree phase lag at the preferred carrier frequency. The purpose of this control block 20 is thus to provide the necessary phase lag for bringing the loop into oscillation, and this can be accomplished by using pure delay, integrating functions or local filter systems.

The control block 20 in FIG. 6 is a local filter O(s) of a general all pass filter type. This filter type is preferred because it has an absolute gain of 1, which means that this implementation has the same transfer function H(s) as the hysteresis system (see Eq. 1). The all pass filter of P'th order is basically a Padé approximation of an ideal time delay, with a transfer function that can be expressed as:

$$O(s) = \frac{s^P - \sum_{m=1}^{P}\left(s^{m-1}\prod_{k=1}^{P+1-m} G_k\right)}{s^P + \sum_{m=1}^{P}\left(s^{m-1}\prod_{k=1}^{P+1-m} G_k\right)}, \quad P = \text{order} \quad (5)$$

The different implementations (FIGS. 5 and 6) of the oscillation control 13a, 13b have equal system performance. However, an additional P integrators will be required for the filter 20 in the case of the non-hysteresis approach, for the same performance. The loop gain is determined by the number of integrators in the global loop. The benefit of a non-hysteresis control (FIG. 4) is the possibility of a very steep phase characteristic around the carrier frequency to achieve low variation of the carrier frequency as function of the modulation index. This property can be valuable in some applications.

According to a further preferred embodiment of the invention, the integrator gains are selected to have a ratio of a multiple of 2. The integrator gains $G_n$ can then be written as:

$$G_n = \frac{G_{n-1}}{2^M}, \text{ where } M \in [0, \infty]$$

Following this approach the integrator gains $G_n$ will be multiplications of a factor of two, and can be realized with the help of a shifting function, leading to reduced complexity. The system characteristics will of course be constrained by the combinations that provide a stabile system or linear phase dependent on the requirements. Examples of normalized gain coefficients $k_n$ are given in the table in FIG. 12.

Figure 7:
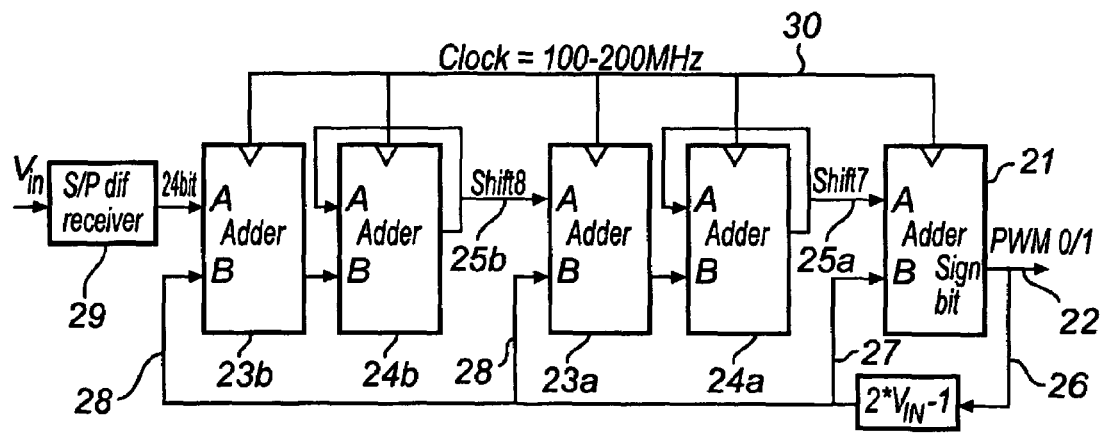
FIG. 7 is a block diagram of a digital implementation of the modulator shown in FIG. 5, N=2.

FIG. 7 shows a more detailed implementation of a 2:nd order modulator according to FIG. 5, using the above described shifting technique for achieving the gains.

First of all, the summing point 18 and comparator 17 in FIG. 3 are embodied by an adder 21, having a sign bit output 22. The output 22 has signal levels of ±V, where V is the peak value of the PWM signal. The summation points 15 in FIG. 5 are further embodied by two adders 23a, 23b, and the integrators 11 in FIG. 5 are embodied by two adders 24a, 24b.

Finally, the integrator gains 12 in FIG. 5 are embodied partly by the gain of the adders 24a, 24b, and partly by two shifting registers 25a, 25b. The shifting registers 25a, 25b act to adjust the gain of the adders 24a, 24b to achieve the desired filtering. The adjustment can be performed by shifting right, i.e. attenuating the gain of the adders 24a, 24b. For example, the first shifting register 25a, which is the gain immediately preceding the comparator 21, can be arranged to perform one shifting operation less than the register 25b, in order to realize a first integrator gain $G_1$ equal to twice the second integrator gain $G_2$. In a similar manner, further gain coefficients according to e.g. FIG. 12 may be accomplished by further adders and shifting registers.

The modulator further has a feedback path 26 connected to the output 22 of the adder 21. This feedback 26 has two separate objectives: Firstly, it provides an oscillation control by providing a feedback 27 to itself. This corresponds to the hysteresis control loop 16 in FIG. 5. Secondly, it provides a feedback 28 of the output 22 to the two adders 23a, 23b, corresponding to the multiple feedback loop 14 in FIG. 5.

An interface block 29 is arranged to receive a serial data stream and placing a sample in a parallel register, here a 24-bit register, which is connected to the adder 23b.

Synchronization of one or a plurality of modulators can be achieved by applying phase lock loops 30 to each of the modulators. Thereby synchronization can be obtained by phase control of the modulators.

A preferred embodiment of a power converter according to the invention is shown in FIG. 8, where a switching output power stage 31 is provided to the modulator 10 as shown in FIG. 2. The switching signal is filtered in an output filter 32, and connected to a load 33, e.g. an audio speaker.

In the illustrated example, the feedback path 14 is moved down stream, and is connected to the output of the switching stage 31. The benefit of this approach is to reduce the errors added by the output stage such as blanking delay errors. The THD and noise introduced by the output stage will be multiplied by the sensitivity function and therefore brought to a very low level.

The skilled person realizes that a feedback instead can be applied from the output filter 32 by adding compensation of at least N−1 poles of the output filter 32, where N is the order of the filter.

The invention can advantageously be used in any digital to analog conversion systems also where high dynamic range and high linearity are required as e.g. audio systems and in particular in switching power amplifiers for audio use or any other power conversion system. Further, the invention can be used for general D/A conversion.

The invention claimed is:

1. A pulse width modulator for converting a digital signal into a PWM signal, comprising:
   a plurality of integrators with integrator gains arranged in series,
   a comparator for comparing the output of the last integrator with a reference, and thereby creating the PWM signal,
   means for realizing self-oscillation at a desired switching frequency, and
   a feedback path connected to a point down stream said comparator and leading to a plurality of summing points, each preceding one of said integrators,
   wherein the PWM signal is quantized in time by a clock frequency of the modulator,
   wherein the integrator gains are adapted to reduce any quantization noise, and
   wherein said desired switching frequency is significantly lower than said clock frequency.

2. A modulator according to claim 1, wherein said feedback path is connected to the output of the comparator.

3. A modulator according to claim 1, wherein the integrator gains are selected to obtain a low pass filter behavior.

4. A modulator according to claim 1, where the integrator gains are selected according to $$G_n = \frac{G_{n-1}}{2^M},$$

where $G_n$ is the gain of integrator n, and $M M\epsilon[0,\infty]$.

5. A modulator according to claim 1, further comprising a signal amplitude limiter following each integrator gain.

6. A modulator according to claim 5, wherein the limitation of the signal amplitude corresponds to a dynamic range of the input signal.

7. A power conversion system comprising:
   a modulator according to claim 1,
   a switching stage connected to the PWM signal, and
   an output filter connected to the switching stage.

8. A system according to claim 7, wherein the feedback path is connected to the output of the switching stage.

9. A system according to claim 7, wherein the feedback path is connected to the output of the output-filter.

10. A system according to claim 7, implemented as a DC-AC converter for audio use or transmission line drivers.

11. The modulator according to claim 1, wherein said desired switching frequency is 200-400 times lower than said clock frequency.

12. A pulse width modulator for converting a digital signal into a PWM signal, comprising:
   a plurality of integrators with integrator gains arranged in series,
   a comparator for comparing the output of the last integrator with a reference, and thereby creating the PWM signal, and
   means for realizing self-oscillation at a desired switching frequency, and
   a feedback path connected to a point down stream said comparator and leading to a plurality of summing points, each preceding one of said integrators,
   wherein the PWM signal is quantized in time by a clock frequency of the modulator,
   wherein the integrator gains are adapted to reduce any quantization noise, and
   wherein the means for self-oscillation includes a positive feedback of the comparator.

13. The modulator according to claim 12, wherein said feedback path is connected to the output of the comparator.

14. A power conversion system comprising:
   the modulator according to claim 12;
   a switching stage connected to the PWM signal; and
   an output filter connected to the switching stage.

15. The system according to claim 14, wherein the feedback path is connected to the output of the switching stage.

16. The system according to claim 14, wherein the feedback path is connected to the output of the output filter.

17. The system according to claim 14, implemented as a DC-AC converter for audio use or transmission line drivers.

18. A pulse width modulator for converting a digital signal into a PWM signal, comprising:
   a plurality of integrators with integrator gains arranged in series,
   a comparator for comparing the output of the last integrator with a reference, and thereby creating the PWM signal,
   means for realizing self-oscillation at a desired switching frequency, and
   a feedback path connected to a point down stream said comparator and leading to a plurality of summing points, each preceding one of said integrators,
   wherein the PWM signal is quantized in time by a clock frequency of the modulator,
   wherein the integrator gains are adapted to reduce any quantization noise, and
   wherein the means for self-oscillation includes a filter or time delay, said filter or time delay being arranged to give the system an open loop phase lag of 180 degrees at the desired switching frequency.

19. The modulator according to claim 8, wherein said feedback path is connected to the output of the comparator.

20. A power conversion system comprising:
the modulator according to claim 8;
a switching stage connected to the PWM signal; and
an output filter connected to the switching stage.

21. The system according to 20, wherein the feedback path is connected to the output of the switching stage.

22. The system according to 20, wherein the feedback path is connected to the output of the output filter.

23. The system according to 20, implemented as a DC-AC converter for audio use or transmission line drivers.

* * * * *